United States Patent [19]

Sham et al.

[11] Patent Number: 5,661,398

[45] Date of Patent: Aug. 26, 1997

[54] TWO CHANNEL EIGHT BEARINGS MAGNETIC RESOLVER CIRCUIT USING DIFFERENTIAL AMPLIFIERS FOR LAP COUNTING AND TIMING

[75] Inventors: Ka Yiu Sham, Great Falls, Va.; Philip Lim-Kong Wong, Geddington, England

[73] Assignee: Acumen, Inc., Sterling, Va.

[21] Appl. No.: 497,448

[22] Filed: Jun. 30, 1995

[51] Int. Cl.$^6$ .................. G01R 33/02; G01R 33/06; G01N 27/72; G06M 11/02

[52] U.S. Cl. ................ 324/247; 324/251; 324/226; 377/12

[58] Field of Search .................. 324/244, 247, 324/251, 252, 226; 377/12, 5, 6, 17, 24.2, 111

[56] References Cited

U.S. PATENT DOCUMENTS

| | | |
|---|---|---|
| 3,905,121 | 9/1975 | Takeda et al. .................. 324/247 |
| 4,371,837 | 2/1983 | Sieverin .................. 324/251 |
| 4,482,255 | 11/1984 | Oygax et al. . |
| 4,530,105 | 7/1985 | Rabinowitz . |
| 4,991,126 | 2/1991 | Reiter . |
| 5,241,270 | 8/1993 | Ng .................. 324/247 |

*Primary Examiner*—Walter E. Snow
*Attorney, Agent, or Firm*—Evenson, McKeown, Edwards & Lenahan, P.L.L.C.

[57] ABSTRACT

A circuit for resolving a magnetic field, including a first channel including a first magnetic field sensor, a first amplifier coupled to and receiving an output from said first magnetic field sensor, and a first three band detector coupled to and receiving an output from said first amplifier. The first three band detector provides a first two bit output. A second channel includes a second magnetic field sensor, a second amplifier coupled to and receiving an output from said second magnetic field sensor, and a second three band detector coupled to and receiving an output from said second amplifier. The second three band detector provides a second two bit output. The first and second magnetic field sensors are arranged orthogonally to one another such that said first and second two bit outputs resolve the magnetic field into eight bearings.

14 Claims, 6 Drawing Sheets

| MAGNETIC BEARING (PHASOR I POINTING) | PHASOR I & II POSITIONS | SENSORS I OUTPUT | | SENSORS II OUTPUT | |
|---|---|---|---|---|---|
| | | "A" | "B" | "C" | "D" |
| NORTH | I↑ →$V_H$ II→$V_L$ | ⊘ | ⊘ | 1 | ⊘ |
| NORTH-EAST | ↘$V_H$ ↘$V_L$ | ⊘ | ⊘ | 1 | 1 |
| EAST | →$V_H$ ↓$V_L$ | 1 | ⊘ | 1 | 1 |
| SOUTH-EAST | ↙↘ $V_H$ $V_L$ | 1 | 1 | 1 | 1 |
| SOUTH | ←$V_H$ ↓$V_L$ | 1 | 1 | 1 | ⊘ |
| SOUTH-WEST | ↙↗ $V_H$ $V_L$ | 1 | 1 | ⊘ | ⊘ |
| WEST | ↑←$V_H$ $V_L$ | 1 | ⊘ | ⊘ | ⊘ |
| NORTH-WEST | ↙↘$V_H$ $V_L$ | ⊘ | ⊘ | ⊘ | ⊘ |

FIG. 5

TWO CHANNEL EIGHT BEARINGS MAGNETIC RESOLVER CIRCUIT USING DIFFERENTIAL AMPLIFIERS FOR LAP COUNTING AND TIMING

FIELD OF THE INVENTION

This invention relates to a lap counting circuit and, more particularly, to a lap counting circuit which makes use of the earth's magnetic field for automatically counting laps.

BACKGROUND OF THE INVENTION

Numerous sports and other fitness activities require that the participant keep track of a number of laps that are completed. For example, a jogger training on a track may run several laps during a training session. Often times, the person loses track of the number of laps completed and is thus unable to determine how far he has run, swam, biked, etc.

A known method for keeping track of the number of laps performed requires that the user manually activate a button or switch on a watch or the like each time a lap is completed. However, many times the runner forgets to activate the switch due, for example, to the monotony of the training.

There is therefore needed a lap counting device which can automatically counts laps without requiring any manual input from the user.

U.S. Pat. No. 4,530,105 describes an automatic lap counter which depends upon the change in the magnetic line of force of the north/south magnetic field for determining laps. The device operates using either an electronic or mechanical flux change detector to detect each 180° shift and direction. Each 180° change produces a pulse which is counted and displayed on a watch. The flux detector makes use of a compass needle mounted to, and operating, a cam plate. A cam follower switch contact is operated when the cam turns through 180° responsive to the change and direction of the user. The cam follower closes a switch which activates a battery to produce the pulse. This known mechanical circuit is disadvantageous as only 180° direction changes are detected. Further, the device requires that the user begin his training in a north or south direction in order to keep an accurate track of the laps. However, this is not necessarily convenient to the user as it often times does not provide the optimal starting point for the training. Still further, this known circuit is mechanically crude and can be subject to numerous erroneous lap counts due to the inaccuracy and fluctuation of the compass needle.

U.S. Pat. Nos. 4,991,126 and 4,482,255 disclose the use of Hall-effect elements for determining the direction and sense of the terrestial magnetic field. However, neither of these references provide any lap counting indications.

There is therefore needed a circuit which accurately and effectively resolves the earth's magnetic field in order to allow for a lap count determination without requiring any predetermined starting or stopping positions by the user.

SUMMARY OF THE INVENTION

These needs are met according to the present invention which provides an eight bearing magnetic resolving circuit having high sensitivity to the earth's magnetic field.

The present invention includes a circuit for resolving a magnetic field, including a first channel including a first magnetic field sensor, a first amplifier coupled to and receiving an output from said first magnetic field sensor, and a first three band detector coupled to and receiving an output from said first amplifier. The first three band detector provides a first two bit output. A second channel includes a second magnetic field sensor, a second amplifier coupled to and receiving an output from said second magnetic field sensor, and a second three band detector coupled to and receiving an output from said second amplifier. The second three band detector provides a second two bit output. The first and second magnetic field sensors are arranged orthogonally to one another such that said first and second two bit outputs resolve the magnetic field into eight bearings.

It is an advantage of the present invention to resolve the earth's magnetic field into eight bearings such that the user can begin his training in any direction. Further, the use of an eight bearing magnetic resolving circuit allows for a more accurate determination of the completion of each lap or portion thereof by providing a greater number of bearings which must be detected before a lap count will be incremented.

It is yet another advantage of the present invention that the eight bearing magnetic resolving circuit makes use of two sensor pairs each composed of two linear Hall-effect sensors arranged together in a back-to-back manner. This has the advantage of providing twice the output differential signal, thus doubling the sensitivity of the sensor to the earth's magnetic field.

It is a further advantage of the present invention to make use of a magnetic concentrator such as a MU-metal rod assembly for each sensor pair. The use of the rod assembly further improves the sensitivity of the Hall-effect sensor pairs.

Other objects, advantages and novel features of the present invention will become apparent from the following detailed description of the invention when considered in conjunction with the accompanying drawings.

BRIEF DESCRIPTION OF THE DRAWINGS

FIG. 5 is a truth table indicating the operation of the earth's magnetic field eight bearing resolver circuit according to the present invention.

DETAILED DESCRIPTION OF THE DRAWINGS

Figure 1:
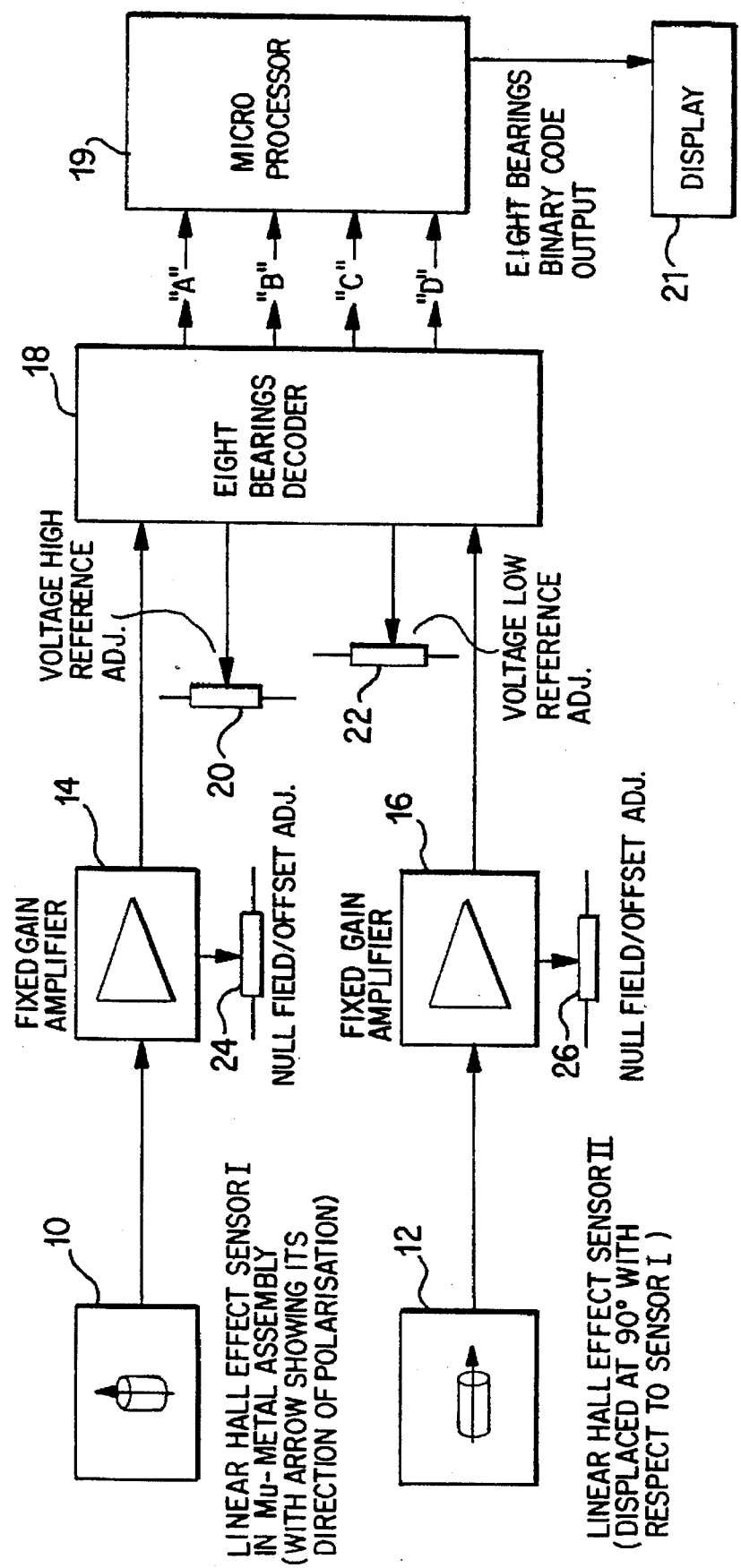
FIG. 1 is a functional block diagram of the earth's magnetic field eight bearing resolver circuit according to the present invention coupled with a microprocessor and display.

Referring to FIG. 1, the earth's magnetic field eight bearing resolver circuit according to the present invention includes a first channel having a magnetic field sensor 10 providing an output to a fixed gain amplifier 14 which is coupled to an eight bearings decoder 18. A second channel includes another magnetic field sensor 12 likewise coupled to a fixed gain amplifier 16 and the eight bearings decoder 18. Null field/offset adjustment circuits 24, 26 are coupled to the fixed gain amplifier 14, 16, respectively. An adjustable high band switching reference voltage circuit 20 and an adjustable low band switching reference voltage circuit 22 are coupled to the eight bearings decoder 18. Eight bearings decoder 18 provides a four bit output code, each bit being labelled A, B, C and D, respectively, to a microprocessor 19. The microprocessor 19 provides various timekeeping functions as is conventionally known. The microprocessor is coupled to a display 21 such as an LCD watch display. The display 21 will additionally indicate the lap count based on the eight bearing decoder's 18 output as processed by the microprocessor 19.

In order to determine the direction of the magnetic field, the magnetic sensors 10, 12 include linear Hall-effect sensors arranged orthogonally with respect to each other. The arrows shown in sensor blocks 10, 12 indicate the direction of polarization of the respective Hall-effect sensor. As the combined magnetic field sensors 10, 12 are rotated in the earth's magnetic field, the sensors' 10, 12 voltage output mathematically describe sine and cosine functions in relation to each other. This allows for the determination of the magnetic field direction which is output as the four bit code from the eight bearings decoder 18 as will be described in greater detail below.

Figure 2:
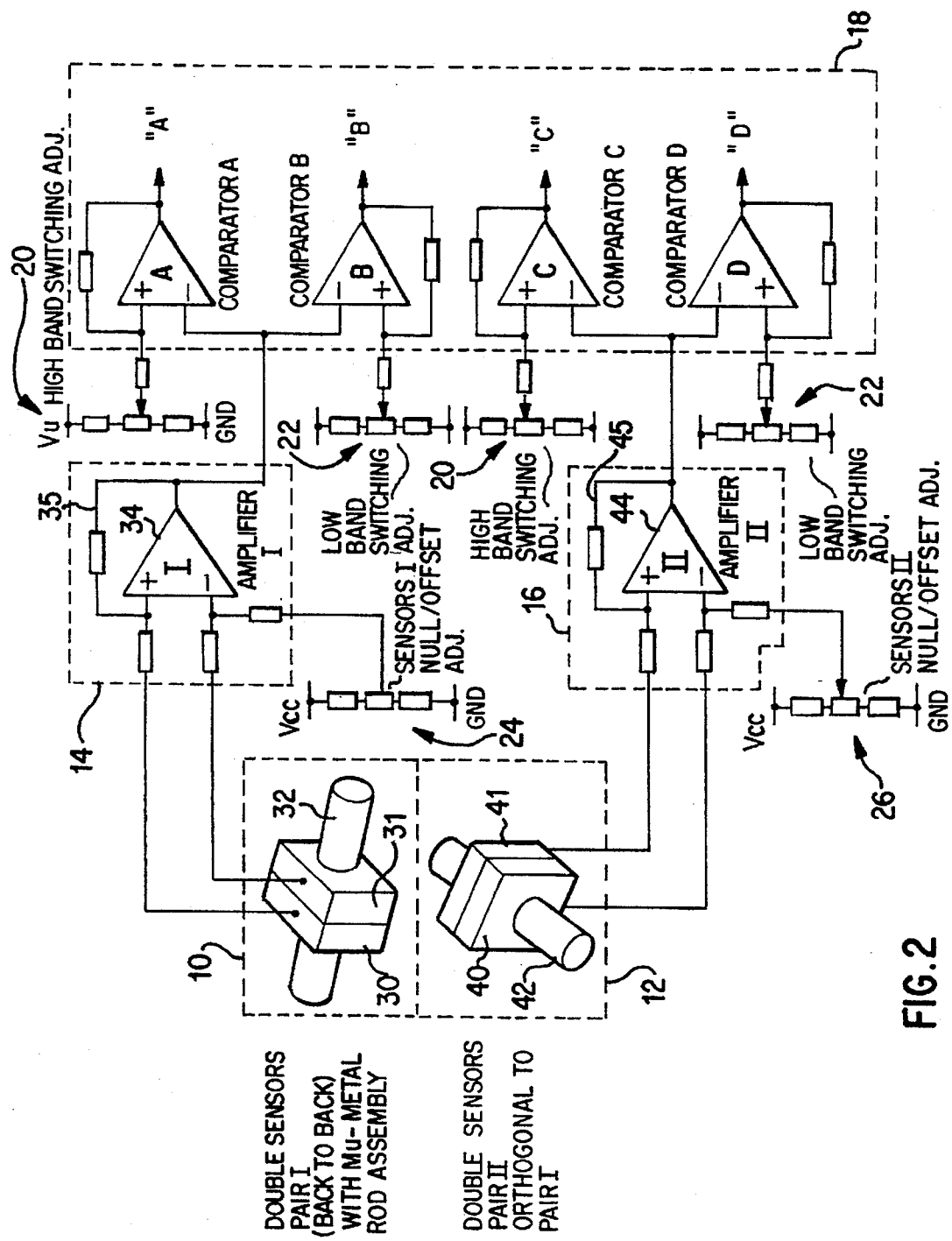
FIG. 2 is a schematic circuit diagram of the earth's magnetic eight bearing resolver according to the present invention.

Referring to FIG. 2, a schematic circuit diagram is shown for the functional block diagram described in FIG. 1. The circuit components of FIG. 2 corresponding to the functional blocks of FIG. 1 are shown contained within correspondingly labelled dashed blocks in FIG. 2. The first channel of the circuit includes two linear Hall-effect sensors 30, 31 arranged together in a back-to-back fashion, i.e., one in the positive direction, the other in the negative direction. Magnetic concentrators 32 in the form of MU-metal rods are positioned at the outward facing ends of each sensor 30, 31. The MU-metal rods 32 function to collect the earth's magnetic field and to provide a magnetic signal gain factor to the respective sensors 30, 31. In this manner, the use of the two linear Hall-effect sensors 30, 31 provide twice the output differential signal.

The double output differential signals are provided to the fixed gain amplifier circuit 14 which includes a differential amplifier 34 receiving the respective outputs from the sensors 30, 31 through a resistance. The differential amplifier 34 provides an output to the eight bearing decoder 18 as well as to the positive input terminal of the differential amplifier 34 via feedback loop 35. A null offset adjustment circuit 24 is coupled to the negative input of the differential amplifier 34. The null offset adjustment circuit includes a series coupling of resistances between a supply voltage $V_{cc}$ and ground. The null/offset adjustment can be performed by varying the resistance of the circuit The output from the fixed gain amplifier 14 is provided to the negative input terminals of two comparators A, B of the decoder 18. The comparators A, B form a three band window detector for the first channel as will be described in greater detail below with respect to FIG. 3. Coupled to the positive input of comparator A is the adjustable switching high band reference voltage $V_H$ from circuit 20. Similarly, the adjustable switching low band reference voltage $V_L$ from circuit 22 is coupled to the positive input of comparator B. Each of comparators A and B include a feedback loop from the output of the respective comparator to its positive input. Both the high and low band adjustable reference voltages $V_H$, $V_L$ are provided by circuits similar to the null/offset adjustment circuit 24 and include a series coupling of resistances between a supply voltage $V_{cc}$ and ground.

A second channel of the earth's magnetic field eight bearings resolver circuit shown in FIG. 2 is identical to the first channel and likewise includes two linear Hall-effect sensors 40, 41 arranged together in a back-to-back manner. The two sensors 40, 41 further include magnetic field concentrator rods 42 facing outward from each respective sensor. The output from the sensors are also likewise provided to a differential amplifier 44 including a feedback loop 45. The output from the differential amplifier 44 is further provided to the decoder 18 where it is supplied to the negative inputs of two further comparators C, D. The comparators C, D are configured in the same manner as comparators A, B and the operation will likewise be described with reference to FIG. 3 below. As shown in FIG. 2, the second pair of sensors 40, 41 are arranged orthogonally with respect to the first sensor pair 30, 31. As both sensors 10, 12 are rotated in the earth's magnetic field, their voltage outputs mathematically describe sine and cosine functions in relation to each other.

The feedback loop for each of the comparators A and B for magnetic sensor 10 and comparators C and D for magnetic sensor 12 are provided with positive feedback resistors that are designed in "hysteresis" in order to remove jitter which occurs due to a slow but noisy moving signal. The high band switching adjustment reference voltage $V_H$ and the low band switching adjustment reference voltage $V_L$ are used to determine the incoming detected magnetic field signal to within the high/mid/low bands as will be shown with respect to FIG. 4. This subsequently allows the eight bearings of the earth's magnetic field to be decoded in accordance with the truth table shown below in FIG. 5, In each channel, amplifiers 14, 16 are provided with a differential configuration as described above. This provides a fixed gain to the small differential signal.

Figure 3:
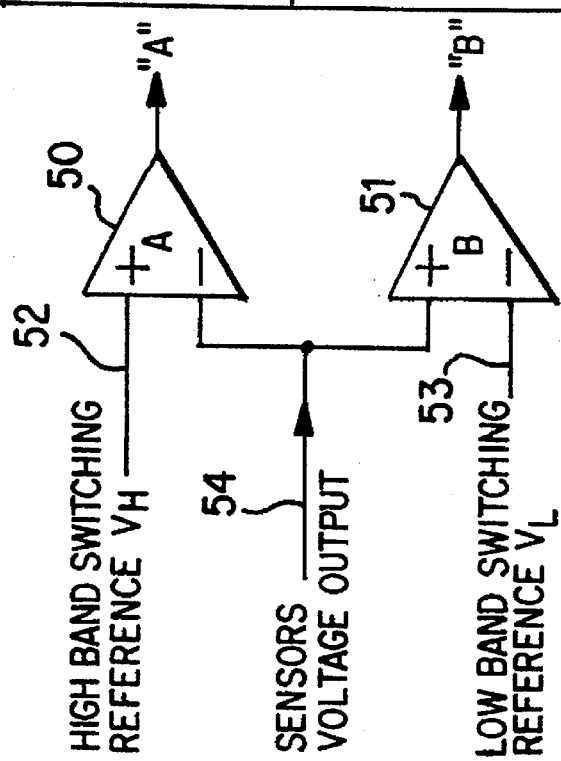
FIG. 3 is an illustration indicating the operation of a three band window detector used in the circuit of the present invention.

Referring to FIG. 3, there is illustrated the schematic diagram and output table for one of the two three band detectors forming the decoder 18. As shown generally, the sensors output voltage is fed to the negative input of the comparators 50, 51, i.e., that is comparators A and B as discussed above. Coupled via line 52 to the positive input of the comparator 50 is the high band switching voltage $V_H$. Similarly, coupled via line 53 to the positive input voltage of comparator 51 is the low band switching reference voltage $V_L$. By way of this configuration, the three band detector provides a two bit output, A and B.

The table shown in FIG. 3 identifies the particular band detected by the sensor based on the outputs of the two bits. When the sensor output signal is less than the low band reference voltage $V_L$ and the high band reference voltage $V_H$, then output A will be "high" and output B will be "high". When the sensor output signal is greater than the low band reference voltage $V_L$ but less than the high band reference voltage $V_H$, then output A will indicate "high" and output B will indicate "low". Finally, when both outputs A and B are "low", then the sensor output signal voltage is greater than the low band reference voltage $V_L$ and the high band reference voltage $V_H$.

It will be readily understood to one of ordinary skilled in the art that the three band detector illustrated in FIG. 3 is identically constructed for the second channel using comparators C and D. Hence, the outputs C and D will also correspond to those of A and B given above.

During the initial set up for the circuit, magnetic sensor 10 and magnetic sensor 12 are in turn aligned perpendicular with the earth's north to south poles, i.e., magnetic field, such that a minimum magnetic field intensity position is obtained. The null/offset adjustment 24, 26 is then correspondingly used to tune out any residue field or offset in the circuit. Such tuning is accomplished when the amplifiers' 14, 16 output is equal to the supply voltage $V_{cc}/2$. In this manner, three conditions are established. (1) When each of the sensors faces north, then their respective amplifier output is greater than $V_{cc}/2$. (2) When each of the sensors face either east or west, then their corresponding amplifier outputs are approximately equal to $V_{cc}/2$. (3) Finally, when each of the sensors face south, then their corresponding amplifiers output is less than $V_{cc}/2$.

Figure 4:
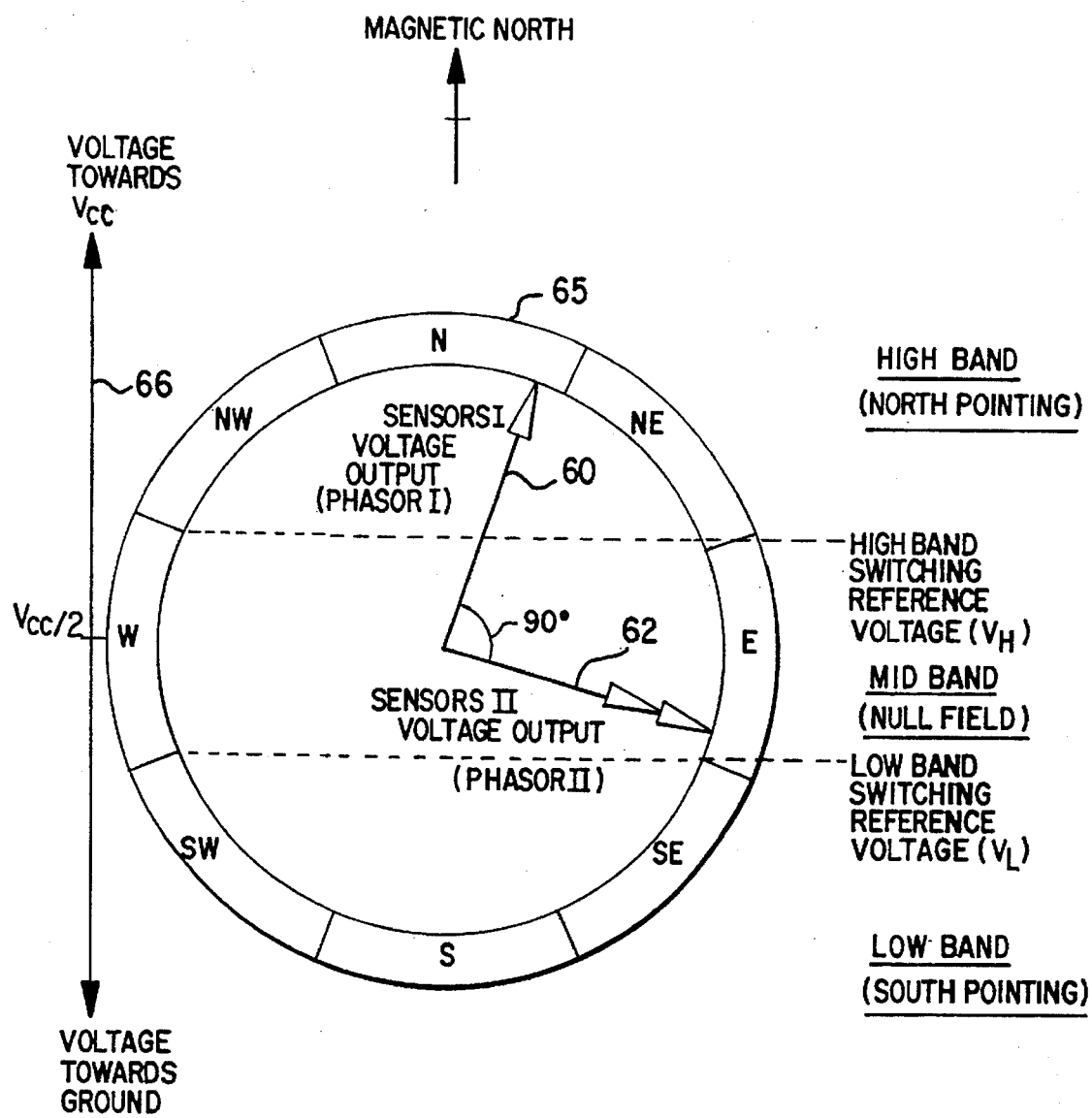
FIG. 4 is a phasor diagram for the sensor pairs indicated in FIG. 2.

Referring to FIG. 4, there is shown a phasor diagram for the magnetic field sensors 10 and 12. In this diagram, an illustrative compass circle 65 is shown. Phasors 60 and 62, corresponding to the magnetic field sensors 10, 12 arranged orthogonally with respect to one another, are shown directed toward a particular compass direction. These phasor indications are likewise shown corresponding to the strength of the supply voltage $V_{cc}$ as shown by arrow 66. In this diagram, a high band or "north pointing" portion is determined by the setting of the high band switching reference voltage $V_H$ to correspond to a voltage slightly greater than $V_{cc}/2$. Similarly, the low band or "south pointing" indication is provided by the level of the low band switching reference voltage $V_L$ shown corresponding to slightly less than $V_{cc}/2$. In this manner, a mid band or "null field" is determined.

These phasors 60, 62 correspond with the outputs of the two three band window detectors described in FIG. 3 which form the decoder 18. Thus, for example, phasor 60 points in a northerly direction and hence outputs A and B are both low indicating a high band. Similarly, phasor 62 points in an eastwardly direction and hence the output of comparators C and D are high and low, respectively, thus indicating the mid band. Because the magnetic field sensors 10 and 12 are initially arranged orthogonally with respect to one another, it is determined that the pointing direction is hence in a northerly direction.

The entire truth table for the eight bearings decoder 18 is set forth in FIG. 5 wherein the magnetic bearing is indicated at the left side of the table, the phasor positions are indicated next to the magnetic bearings, and the sensor outputs from the comparators A, B, C and D are shown on the right side of the table. Thus, as can be seen for the north magnetic bearing, outputs A, B, C and D provide a hexadecimal binary output code of "0010". In this manner, depending upon the output from the decoder 18, the microprocessor 19 determines the magnetic bearing in accordance with the truth table 70.

Figure 6A:
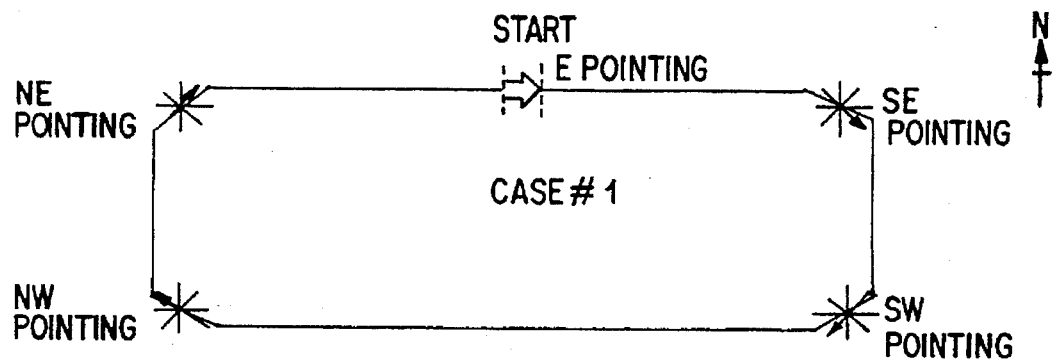
FIGS. 6a–6c illustrate the various starting positions for use with the eight bearing magnetic resolver circuit of the present invention.
Figure 6B:
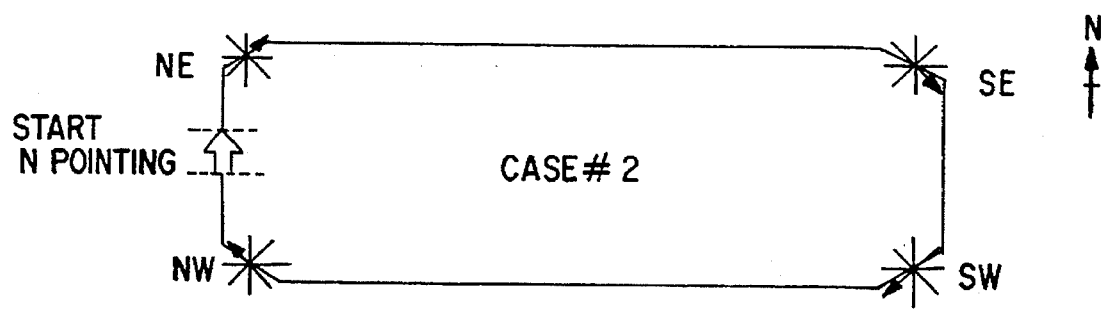
Figure 6C:
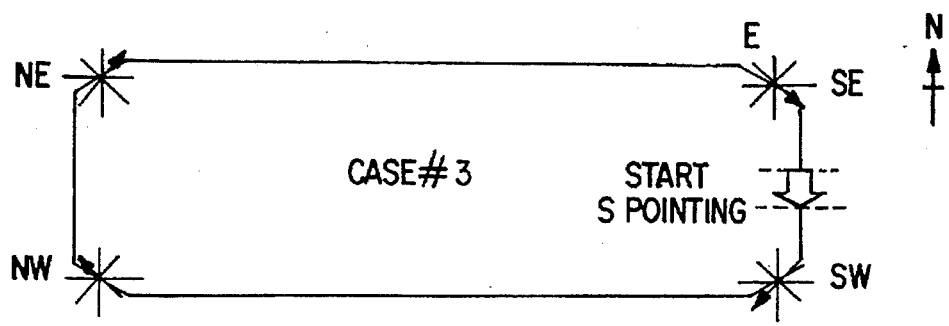

Referring to FIGS. 6a–6c, there is shown a series of diagrams indicating various "start" positions for a jogger. It can readily be understood that the "start" position is irrelevant when using a lap counter having an eight bearings resolver magnetic field circuit according to the present invention. For example, FIG. 6a indicates the start position in an eastward direction. Thus, a jogger would, for example, cross eight bearings (SE, S, SW, W, NW, N, NE) before returning to the eighth bearing (E) and hence completing a lap. By using a two channel magnetic field detector having orthogonally arranged Hall-effect sensors, any start position can be used without introducing a significant amount of error into a subsequently determined lap count. FIGS. 6b and 6c show the start position corresponding to a north and south direction, respectively. Because in reality there is no control over the start position of a user, the initial magnetic bearing of the circuit is stored in the microprocessor prior to the beginning of a lap.

It will be readily understood by those of ordinary skilled in the art that the output from the decoder 18 can be continuously input to the microprocessor control in order to tabulate the bearing crossings and hence the lap count. Further, the microprocessor can provide other functions such as split time, total elapse time, average speed, maximum speed and total distance travelled. The microprocessor can display this information on a liquid crystal display.

In operation, for a typical training session, the user programs into the microprocessor the lap number and lap distance, thus starting the timer for a trial. This initiates the unit to read the initial earth's magnetic field bearing provided by the eight bearings magnetic field resolver circuit. At the completion of the lap, that is when the same magnetic bearing is again registered by the microprocessor, the lap count is incremented. As other advantageous features, the microprocessor can display the lap count, split time, average speed, total elapsed time, total distance as well as provide an alert signal indicating the end of a training session.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A circuit for resolving a magnetic field, comprising:
   a first channel including a first magnetic field sensor, a first amplifier coupled to and receiving an output from said first magnetic field sensor, and a first three band detector coupled to and receiving an output from said first amplifier, said first three band detector providing a first two bit output;
   a second channel including a second magnetic field sensor, a second amplifier coupled to and receiving an output from said second magnetic field sensor, and a second three band detector coupled to and receiving an output from said second amplifier, said second three band detector providing a second two bit output;
   wherein said first and second magnetic field sensors are arranged orthogonally to one another such that said first and second two bit outputs resolve the magnetic field into eight bearings;
   a null field/offset adjustment circuit coupled to said first and second amplifiers; and
   a high band switching reference adjustment circuit and a low band switching reference adjustment circuit coupled to said first and second three band window detectors.

2. A circuit according to claim 1, wherein each of said first and second magnetic field sensors comprise two linear Hall-effect sensors arrange back-to-back to provide a doubled output differential signal.

3. A circuit according to claim 2, wherein each of said first and second magnetic field sensors include a magnetic concentrator to provide a magnetic signal gain to said sensor.

4. A circuit according to claim 3, wherein said magnetic concentrator is a MU-metal rod arranged on each outward facing side of said two linear Hall-effect sensors.

5. A circuit according to claim 1, wherein each of said first and second amplifiers include a differential amplifier having a feedback loop, a positive terminal of said differential amplifier receiving an output of one of said two linear Hall-effect sensors and a negative terminal receiving an output of the other of said two linear Hall-effect sensors and an output of said null field/offset adjustment circuit.

6. A circuit according to claim 5, wherein each of said first and second three band detectors include first and second comparators providing first and second bit outputs forming said two bit output, said first and second comparators having negative inputs which receive the output of said differential amplifier, a positive input of said first comparator receiving an output of said high band switching reference circuit and a positive input of said second comparator receiving an output of said low band switching reference circuit.

7. A circuit according to claim 6, wherein said first and second bit outputs of each of said first and second three band detectors provides a four bit output for resolving the magnetic field into the eight bearings.

8. A lap counter, comprising:

a microprocessor having a display; and an eight bearing resolver circuit coupled to said microprocessor;

wherein said eight bearing resolver circuit comprises a first channel including a first magnetic field sensor, a first amplifier coupled to and receiving an output from said first magnetic field sensor, and a first three band detector coupled to and receiving an output from said first amplifier, said first three band detector providing a first two bit output;

a second channel including a second magnetic field sensor, a second amplifier coupled to and receiving an output from said second magnetic field sensor, and a second three band detector coupled to and receiving an output from said second amplifier, said second three band detector providing a second two bit output;

wherein said first and second magnetic field sensors are arranged orthogonally to one another such that said first and second two bit outputs are provided to said microprocessor for resolving the magnetic field into eight bearings, said microprocessing incrementing a lap count each time said eight bearings are crossed;

a null field/offset adjustment circuit coupled to said first and second amplifiers; and a high band switching reference adjustment circuit and a low band switching reference adjustment circuit coupled to said first and second three band window detectors.

9. A circuit according to claim 8, wherein each of said first and second magnetic field sensors comprise two linear Hall-effect sensors arrange back-to-back to provide a doubled output differential signal.

10. A circuit according to claim 8, wherein each of said first and second magnetic field sensors include a magnetic concentrator to provide a magnetic signal gain to said sensor.

11. A circuit according to claim 8, wherein said magnetic concentrator is a MU-metal rod arranged on each outward facing side of said two linear Hall-effect sensors.

12. A circuit according to claim 8, wherein each of said first and second amplifiers include a differential amplifier having a feedback loop, a positive terminal of said differential amplifier receiving an output of one of said two linear Hall-effect sensors and a negative terminal receiving an output of the other of said two linear Hall-effect sensors and an output of said null field/offset adjustment circuit.

13. A circuit according to claim 12, wherein each of said first and second three band detectors include first and second comparators providing first and second bit outputs forming said two bit output, said first and second comparators having negative inputs which receive the output of said differential amplifier, a positive input of said first comparator receiving an output of said high-bind switching reference circuit and a positive input of said second comparator receiving an output of said low band switching reference circuit.

14. A circuit according to claim 13, wherein said first and second bit outputs of each of said first and second three band detectors provides a four bit output for resolving the negative field into the eight bearings.

* * * * *